(12) United States Patent
McConnelee et al.

(10) Patent No.: US 9,117,813 B2
(45) Date of Patent: Aug. 25, 2015

(54) INTEGRATED CIRCUIT PACKAGE AND METHOD OF MAKING SAME

(75) Inventors: Paul Alan McConnelee, Albany, NY (US); Arun Virupaksha Gowda, Rexford, NY (US)

(73) Assignee: General Electric Company, Schenectady, NY (US)

( * ) Notice: Subject to any disclaimer, the term of this patent is extended or adjusted under 35 U.S.C. 154(b) by 184 days.

(21) Appl. No.: 13/524,369

(22) Filed: Jun. 15, 2012

(65) Prior Publication Data
US 2013/0334706 A1 Dec. 19, 2013

(51) Int. Cl.
*H01L 21/00* (2006.01)
*H01L 23/498* (2006.01)
(Continued)

(52) U.S. Cl.
CPC ...... *H01L 23/49822* (2013.01); *H01L 21/4857* (2013.01); *H01L 23/5383* (2013.01); *H01L 24/19* (2013.01); *H01L 24/20* (2013.01); *H01L 24/27* (2013.01); *H01L 24/83* (2013.01); *H01L 24/92* (2013.01); *H01L 24/94* (2013.01); *H01L 21/6836* (2013.01); *H01L 24/29* (2013.01); *H01L 24/32* (2013.01); *H01L 2221/68327* (2013.01); *H01L 2221/68381* (2013.01); *H01L 2224/2101* (2013.01); *H01L 2224/221* (2013.01); *H01L 2224/27003* (2013.01); *H01L 2224/2732* (2013.01); *H01L 2224/2741* (2013.01); *H01L 2224/27312* (2013.01); *H01L 2224/27416* (2013.01); *H01L 2224/27418* (2013.01); *H01L 2224/27422* (2013.01); *H01L 2224/27436* (2013.01); *H01L 2224/27848* (2013.01); *H01L 2224/2919* (2013.01); *H01L 2224/32225* (2013.01); *H01L 2224/83101* (2013.01);

(Continued)

(58) Field of Classification Search
CPC ......... H01L 21/76; H01L 21/78; H01L 23/48; H01L 2924/00014; H01L 2924/00; H01L 2924/01029; H01L 2224/32225; H01L 2924/01013
USPC .......................................... 438/107, 113, 118
See application file for complete search history.

(56) References Cited

U.S. PATENT DOCUMENTS 5,353,195 A 10/1994 Fillion et al.
5,527,741 A * 6/1996 Cole et al. ..................... 438/107

(Continued)

FOREIGN PATENT DOCUMENTS

EP 0253444 A2 1/1988
EP 0707340 A2 4/1996
EP 2184774 A1 5/2010
EP 2434539 A2 3/2012
(Continued)

OTHER PUBLICATIONS

EP Search Report and Opinion dated Oct. 7, 2013 from corresponding EP Application No. 13171914.8.

(Continued)

*Primary Examiner* — Andy Huynh
(74) *Attorney, Agent, or Firm* — Ziolkowski Patent Solutions Group, SC; Jean K. Testa

(57) ABSTRACT

A chip package includes a first die with an active surface having at least one die pad positioned thereon; a first adhesive layer having a first surface coupled to the active surface of the first die and a second surface opposite the first surface; and a first dielectric layer having a top surface. A first portion of the top surface of the first dielectric layer is coupled to the second surface of the first adhesive layer. A second portion of the top surface of the first dielectric layer, distinct from the first portion, is substantially free of adhesive.

6 Claims, 13 Drawing Sheets

(51) Int. Cl.
  *H01L 23/538* (2006.01)
  *H01L 23/00* (2006.01)
  *H01L 21/48* (2006.01)
  *H01L 21/683* (2006.01)
  *H05K 3/30* (2006.01)

(52) U.S. Cl.
  CPC ............... *H01L2224/83191* (2013.01); *H01L 2224/83192* (2013.01); *H01L 2224/83855* (2013.01); *H01L 2224/83856* (2013.01); *H01L 2224/92* (2013.01); *H01L 2224/9202* (2013.01); *H01L 2224/92144* (2013.01); *H01L 2224/94* (2013.01); *H01L 2924/07802* (2013.01); *H01L 2924/3511* (2013.01); *H05K 3/305* (2013.01)

(56) References Cited

U.S. PATENT DOCUMENTS

| | | |
|---|---|---|
| 6,242,282 B1 | 6/2001 | Fillion et al. |
| 8,008,125 B2 | 8/2011 | McConnelee et al. |
| 8,114,712 B1 | 2/2012 | McConnelee et al. |
| 2002/0173080 A1 | 11/2002 | Saia et al. |
| 2005/0037537 A1 | 2/2005 | Kim et al. |
| 2007/0235810 A1 | 10/2007 | Delgado et al. |
| 2011/0156261 A1 | 6/2011 | Kapusta et al. |

OTHER PUBLICATIONS

EP Search Report and Written Opinion dated Feb. 21, 2014 from corresponding EP Patent Application No. 13171914.8.

* cited by examiner

INTEGRATED CIRCUIT PACKAGE AND METHOD OF MAKING SAME

BACKGROUND OF THE INVENTION

Embodiments of the invention relate generally to integrated circuit packages and, more particularly, to adhesive placement within the integrated circuit package.

As integrated circuits become increasingly smaller and yield better operating performance, packaging technology for integrated circuit (IC) packaging has correspondingly evolved from leaded packaging to laminated-based ball grid array (BGA) packaging and eventually to chip scale packaging (CSP). Advancements in IC chip packaging technology are driven by ever-increasing needs for achieving better performance, greater miniaturization, and higher reliability. New packaging technology has to further provide for the possibilities of batch production for the purpose of large-scale manufacturing thereby allowing economy of scale.

A standard CSP manufacturing process typically begins by mounting a dielectric substrate or flex layer to a frame that stabilizes the substrate during the manufacturing process. An adhesive is dispensed in liquid form onto the surface of the dielectric substrate and the frame is spun rapidly to spread the liquid adhesive to a uniform thickness across the entire surface of the dielectric. Next, one or more dies are positioned active side down into the adhesive and the adhesive is cured. A plurality of re-distribution layers are then deposited onto the dielectric substrate and patterned to form a thin-film metal re-routing and interconnection system, with eight or more re-distribution layers being common. The re-distribution layers are typically formed from a benzocyclobutene (BCB) or polyimide material, for example, and applied via a spin-on or lamination application process. The electrical connection between the laminate re-distribution layers and the die(s) form an input/output (I/O) system to and from the die(s).

Advancements in IC packaging requirements pose challenges to the existing embedded chip build-up process. As IC packages become thinner, the adhesive layer may cause the IC package to warp or otherwise become distorted as a result of uneven stress distributions on the top and bottom surfaces of the dielectric layer. Further, in order to manufacture smaller and more complex multi-chip IC packages, dies must be positioned more closely together and with great precision on the dielectric. However, the adhesive layer that couples the dies to the dielectric can make precise alignment of closely spaced dies difficult. For example, when two or more dies are positioned in close proximity to one another on the dielectric, the dies have a tendency to "swim" or move out of the desired position during the adhesive curing process. In addition to merely moving out of the desired position, closely spaced dies may be attracted to one another while the adhesive is curing, a phenomenon that may cause the undesired result of dies touching or becoming stuck to one another in the final chip package.

Accordingly, there is a need for a method of chip package fabrication that minimizes the warpage and distortion that can be caused by the adhesive layer and that allows for closer die spacing and precise die alignment in the IC package. There is a further need for the fabrication method to be readily incorporated into an assembly process, minimize processing time, and provide for a low cost assembly.

BRIEF DESCRIPTION OF THE INVENTION

In accordance with one aspect of the invention, a chip package includes a first die comprising an active surface having at least one die pad positioned thereon; a first adhesive layer having a first surface coupled to the active surface of the first die and a second surface opposite the first surface; and a first dielectric layer having a top surface, wherein a first portion of the top surface of the first dielectric layer is coupled to the second surface of the first adhesive layer. A second portion of the top surface of the first dielectric layer, distinct from the first portion, is substantially free of adhesive.

In accordance with another aspect of the invention, a method of forming an integrated chip package includes providing a first semiconductor die comprising an active surface having at least one contact pad positioned thereon, applying an adhesive layer to the active surface of the first semiconductor die, and adhering the first semiconductor die having the adhesive layer applied thereto to a top surface of a dielectric substrate by way of the adhesive layer.

In accordance with another aspect of the invention, an integrated chip package includes a dielectric substrate and a first die assembly. The first die assembly includes a semiconductor die having an active surface with contact pads positioned thereon and a non-conductive adhesive layer having a first surface coupled to the active surface of the semiconductor die. A surface area of the first surface of the adhesive layer is substantially equal to a surface area of the active surface of the semiconductor die. A second surface of the adhesive layer, opposite the first surface, is coupled to a surface of the dielectric substrate. A subportion of the surface of the flexible substrate adjacent to the first die assembly is substantially free of adhesive.

In accordance with another aspect of the invention, a method of forming an integrated chip package includes providing a dielectric substrate having a die location positioned on a top surface thereof, providing a first semiconductor die comprising an active surface having at least one contact pad positioned thereon, and applying an adhesive layer to one of the active surface of the first semiconductor die and the die location of the dielectric substrate. The adhesive layer has a surface area approximately equal to the surface area of the active surface of the first semiconductor die. The method further includes adhering the first semiconductor die to the top surface of the dielectric substrate by way of the adhesive layer.

In accordance with another aspect of the invention, a method of forming an integrated chip package includes providing a dielectric substrate having a plurality of die locations positioned on a surface thereof and applying a patterned adhesive layer onto the plurality of die locations of the dielectric substrate such that a gap is formed on the surface of the dielectric substrate between adjacent die locations, the gap being substantially free of adhesive. The method also includes adhering a plurality of semiconductor dies to the dielectric substrate via the adhesive layer.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
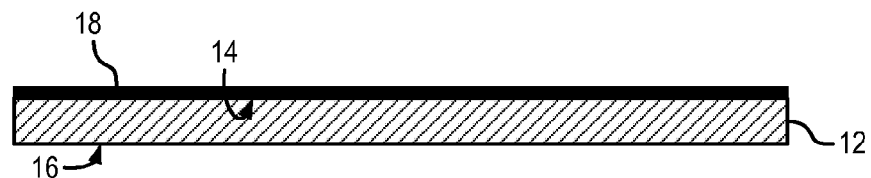
FIGS. 1-7 are schematic diagrams showing steps of making an integrated chip package in accordance with an embodiment of the invention.

Referring to FIGS. 1-7, steps in a technique for manufacturing a chip package 10 (i.e., a chip build-up) are set forth, according to an embodiment of the invention, with side cross-sectional views and top views of chip package 10 being shown at various stages of the build-up process. Referring to FIG. 1, an initial flexible polymer laminate layer or dielectric substrate 12, such as Kapton®, Ultem®, polytetrafluoroethylene (PTFE), or another polymer/polyimide film, is provided. As shown in FIG. 1, dielectric layer 12 comprises a top surface 14 and a bottom surface 16. According to the build-up process, a metal layer 18 is deposited on the top surface 14 of dielectric layer 12. According to various embodiments, metal layer 18 may be formed of a conductive material such as copper, titanium, chrome, and the like. Metal layer 18 may be formed on dielectric layer 12 using a sputtering and plating technique or added in any other suitable manner, such as electroplating.

Figure 2:
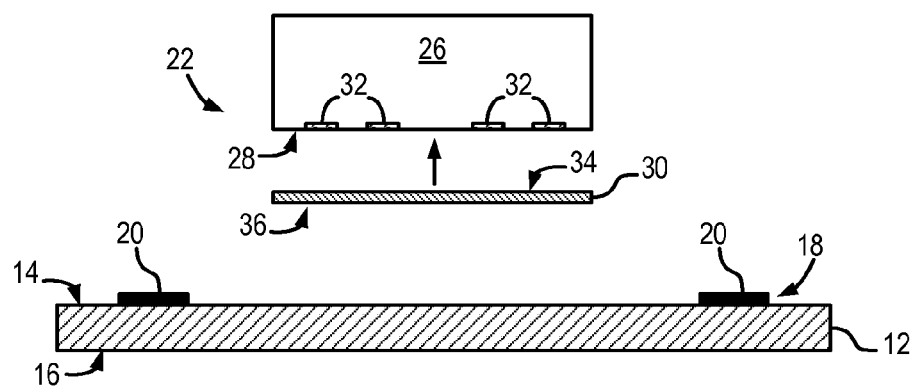

Referring to FIG. 2, metal layer 18 is patterned, using a common printed circuit board lithography process, for example, to form metallization paths 20. Next, a die assembly 22 is aligned with a portion 24 of top surface 14 of dielectric layer 12 that is free of metallization paths 20. As shown, die assembly 22 includes a die 26 having an active surface 28 with an adhesive layer 30 affixed thereto. Active surface 28 of die 26 includes any number of die pads or contact pads 32. Die 26 may be any of various die types, such as, for example, a memory die type, a processing die type, a logic die type, and an application specific integrated circuit (ASIC) die type. Adhesive layer 30 has a first surface 34 and a second surface 36 and is formed using a non-conductive adhesive material that is drillable once fully cured, such as an epoxy, for example. In one embodiment, adhesive layer 30 is partially cured after being applied to die 26. Adhesive layer 30 may be formed on active surface 28 of die 26 using a number of different techniques, as set forth in detail with respect to FIGS. 10-18.

Figure 3:
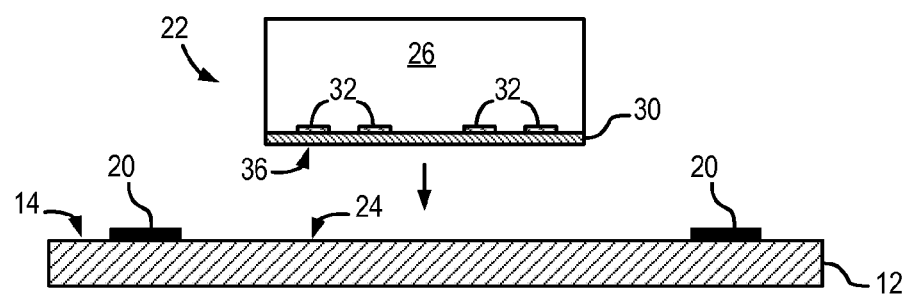
Figure 4:
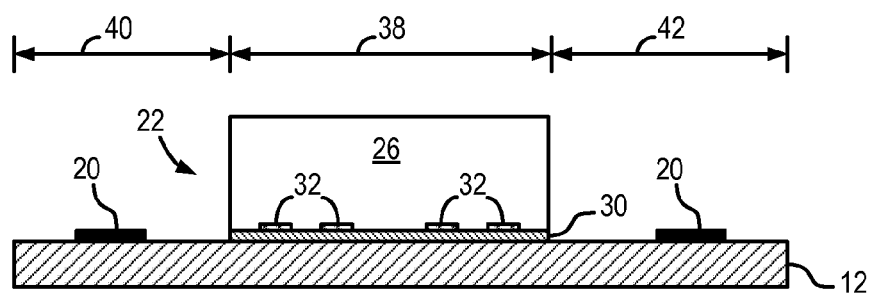

Referring now to FIGS. 3 and 4, in a next step of the build-up technique of chip package 10, die assembly 22 is affixed to dielectric layer 12 via adhesion between first surface 36 of adhesive layer 30 and top surface 14 of dielectric layer 12. In one embodiment, a heated tip or collet of a pick-and-place machine or vacuum chuck is used to pick up and heat die assembly 22 prior to positioning assembly 22 on dielectric layer 12. When heated die assembly 22 is placed on portion 24 of dielectric layer 12, heat from the vacuum chuck and/or dielectric layer 12 causes adhesive layer 30 to become tacky, and adhesive layer 30 bonds to dielectric layer 12. Any voids or air gaps between die assembly 22 and dielectric layer 12 may be removed using vacuum lamination. In an alternate embodiment, adhesive layer 30 remains tacky after being applied to die 26. Thus, a pick-and-place machine may be used to bond die assembly 22 to dielectric layer 12 without the need to apply heat.

Securing die assembly 22 to dielectric layer 12 includes fully curing adhesive layer 30. As shown in FIG. 4, adhesive layer 30 is affixed to a portion 38 of top surface 14 of dielectric layer 12 and portions 40, 42 of top surface 14, which are adjacent to portion 38, are substantially free of adhesive.

Figure 5:
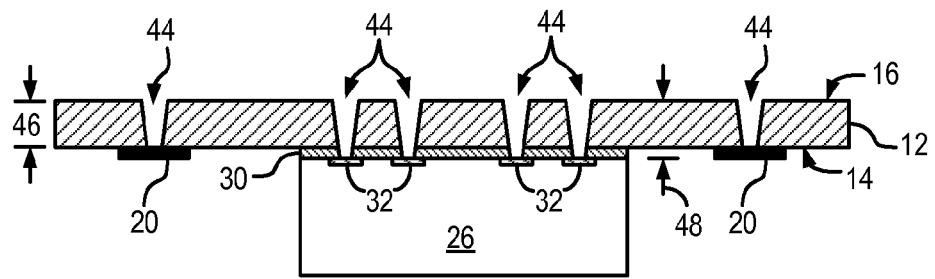

Referring now to FIG. 5, dielectric layer 12 is patterned to form a plurality of vias 44 which are drilled either through the thickness 46 of the dielectric layer 12 or the combined thickness 48 of dielectric layer 12 and adhesive layer 30. According to an exemplary embodiment, vias 44 are formed at positions corresponding to metallization paths 20 and to contact pads 32 so as to expose metallization paths 20 and contact pads 32. Alternatively, it is also recognized that vias 44 may be formed by way of other methods including plasma etching, photo-definition, or mechanical drilling processes.

Figure 6:
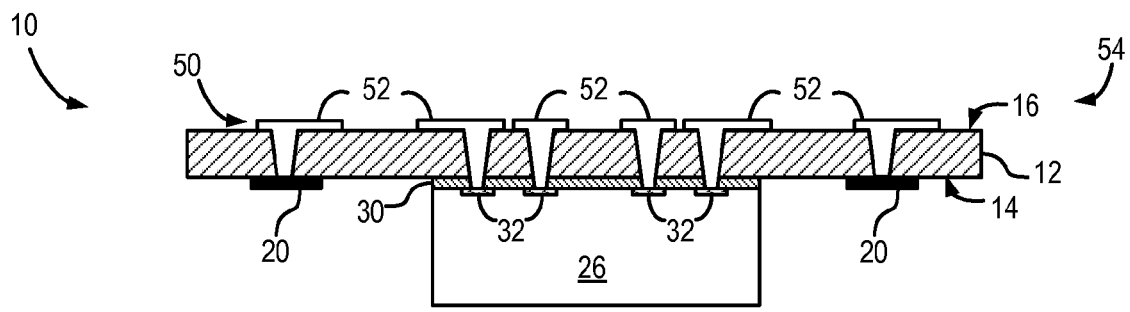

As shown in FIG. 6, a next step of the build-up technique of chip package 10 includes the application of a second metal layer 50 to the bottom surface 16 of dielectric layer 12 by way of, for example, a sputtering or electroplating process. Second metallization layer 50 is subsequently patterned or etched to form metal interconnects 52. According to one embodiment of the invention, the metal layer/material is patterned and etched such that metal interconnects 52 are formed that extend from bottom surface 16 of dielectric layer 12 and down through vias 44. Metal interconnects 52 thus form an electrical connection with metallization paths 20 and contact pads 32. Together, dielectric layer 12, vias 44, and metal interconnects 52 form an initial re-distribution layer 54.

Figure 7:
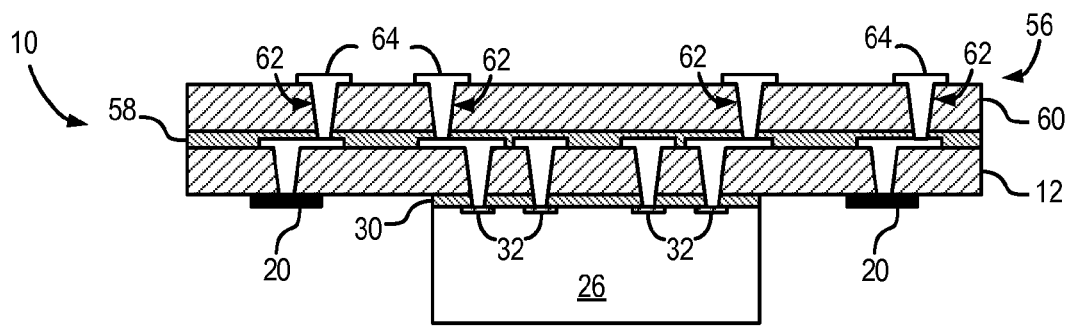

As further shown in FIG. 7, in an optional next step of the manufacturing technique, one or more additional re-distribution layers 56 are formed on initial re-distribution layer 54 through a series of lamination and patterning steps. A conventional adhesive layer 58 is applied between initial re-distribution layer 54, and an additional dielectric layer 60 is applied thereto. A plurality of vias 62 is formed in additional dielectric layer 60, and metal interconnects 64 are formed/patterned to extend down through vias 62 and through additional dielectric layer 60 so as to electrically connect each additional re-distribution layer 56. While only one additional re-distribution layer 56 is shown in FIG. 7, it is recognized that more re-distribution layers could be similarly applied based on a desired configuration.

Figure 8:
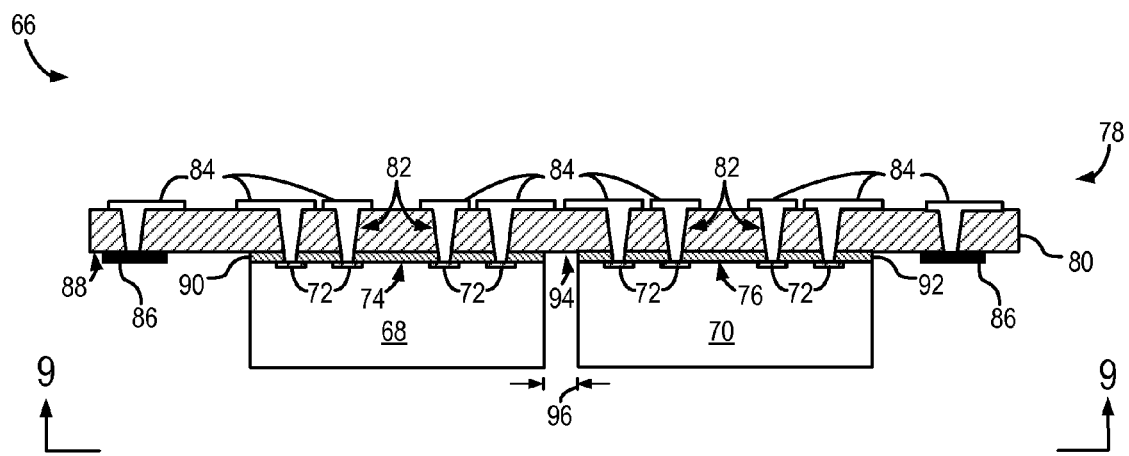
FIG. 8 is a sectional view of an integrated multi-chip package in accordance with an embodiment of the invention.

While chip package 10 is illustrated as including one die 26, one skilled in the art will readily recognize that the manufacturing technique set forth with respect to FIGS. 1-7 is equally applicable for use in manufacturing a chip package with more than one die, such as multi-chip package 66 shown in FIG. 8, which includes multiple dies 68, 70 each having contact pads 72 on respective active surfaces 74, 76. Multi-chip package 66 includes a re-distribution layer 78, similar to re-distribution layer 54 (FIG. 6), comprising a dielectric layer 80 with vias 82 and metal interconnects 84. Similar to chip package 10 (FIG. 6), metallization paths 86 formed are on a top surface 88 of dielectric layer 80.

Figure 9:
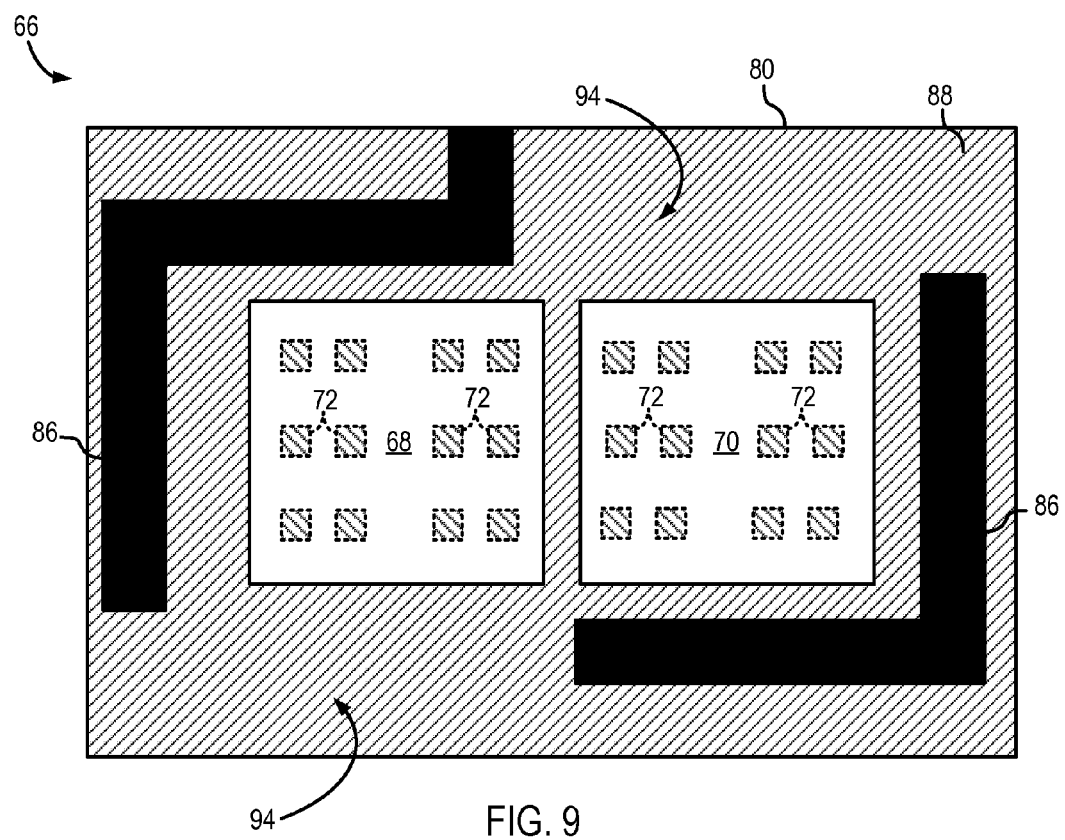
FIG. 9 is a bottom view of the integrated multi-chip package of FIG. 8.
Figure 10:
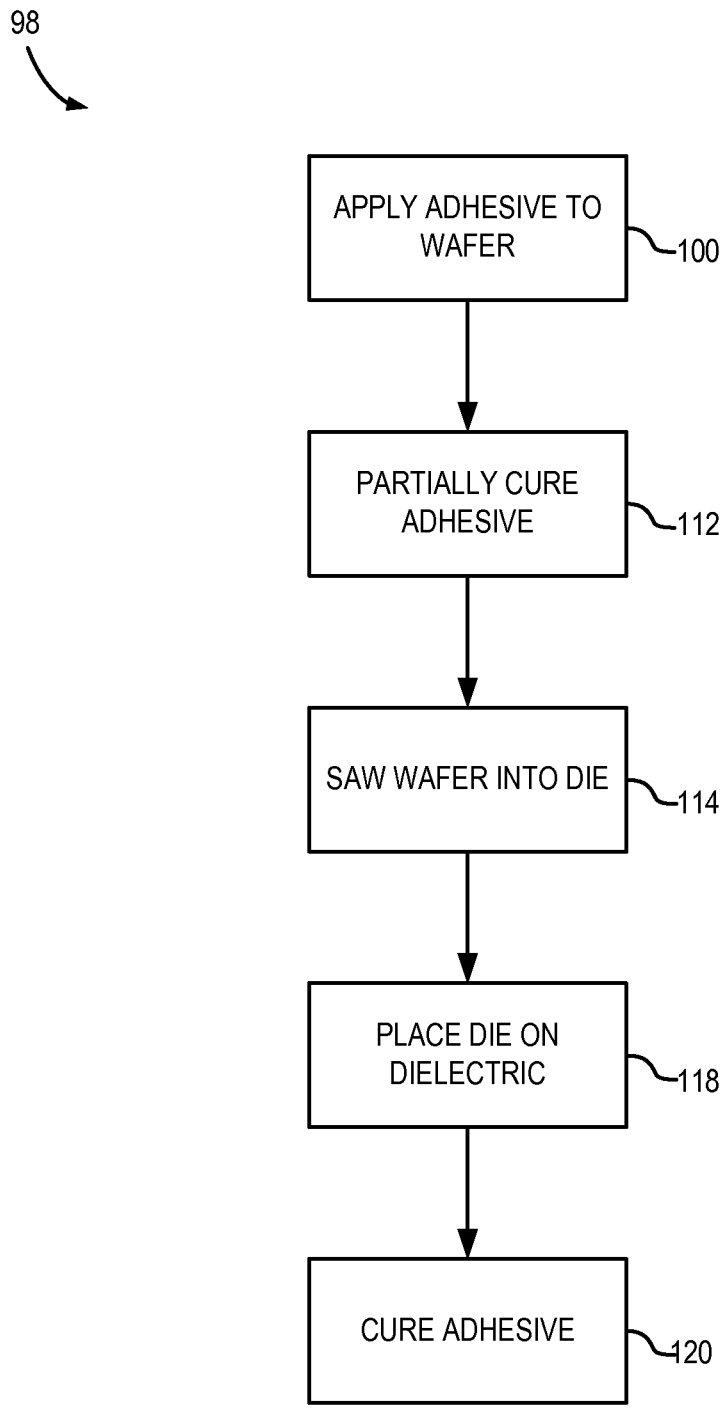
FIG. 10 is a flow chart illustrating steps of making an integrated chip package in accordance with an embodiment of the invention.
Figure 11:
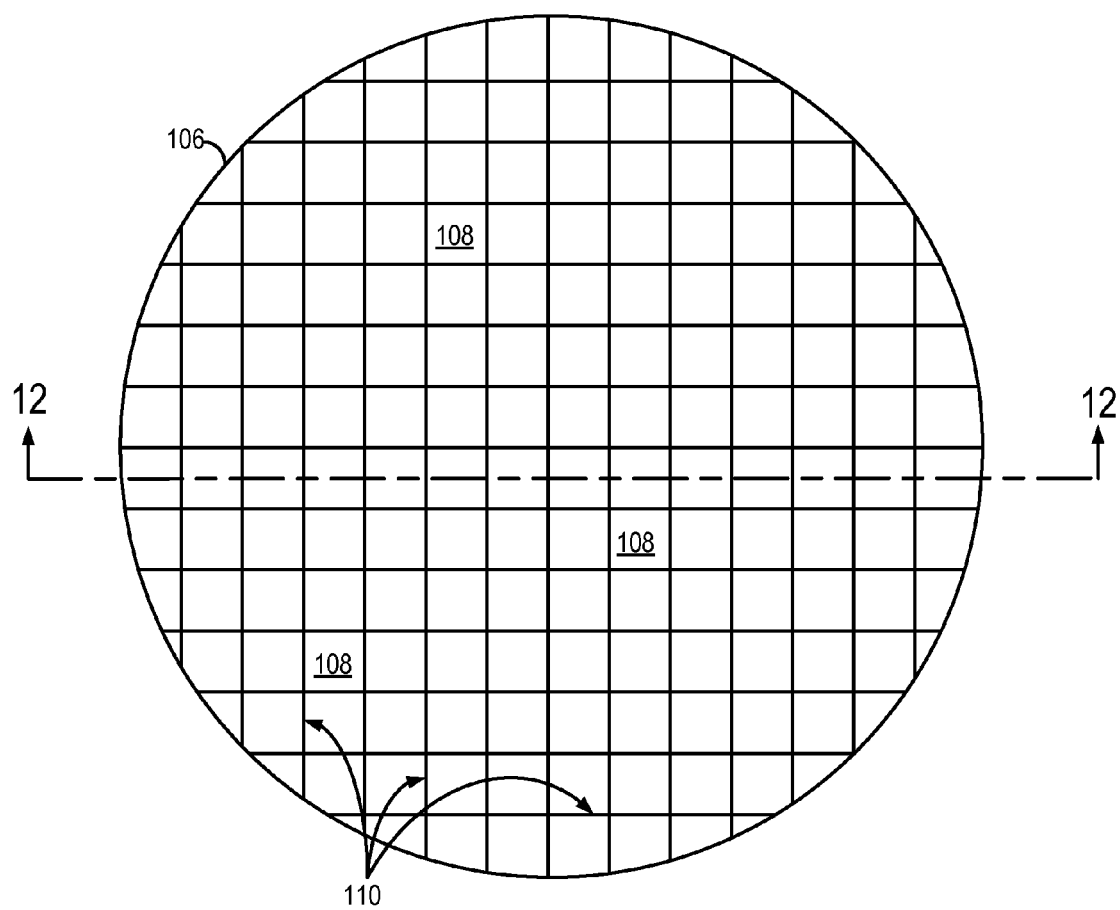
FIG. 11 is a bottom view of a wafer assembly according to an embodiment of the invention.

As shown, each die 68, 70 is attached to a dielectric layer 80, similar to dielectric layer 12 (FIG. 1), by a respective adhesive layer 90, 92, similar to adhesive layer 30 (FIG. 2). Because each adhesive layer 90, 92 is applied directly to a respective die 68, 70 rather than as a solid layer on top surface 88 of dielectric layer 80, adhesive 90, 92 is substantially limited to the surface area of dies 68, 70. Thus, an adhesive-free area 94 exists on top surface 88 of dielectric layer 80 and substantially surrounds dies 68, 70, as shown in FIG. 9.

The resulting gap 96 between respective adhesive layers 90, 92 allows dies 68, 70 to be positioned more accurately and closer together than in a package where the adhesive layer is formed across the entire surface of the dielectric layer. That is, because top surface 88 of dielectric layer 80 is free of adhesive in area 94, no continuous surface of adhesive exists between or around dies 68, 70 on which the die could swim out of position or be attracted together during the curing process.

According to an embodiment of the invention, multiple dies 68, 70 may be configured to perform identical tasks. For example, dies 68, 70 may be of one die type configured to perform memory functions or processor functions. However, according to another embodiment of the invention, dies 68, 70 are not all configured to perform identical tasks or to be of the same die type. For example, a first die type may be configured to perform tasks of a first processor type, a second die type may be configured to perform tasks of a second processor type, and a third die type may be configured to perform tasks of a memory type as examples. Other die types are also contemplated herein.

Referring now to FIGS. 10-13 simultaneously, a technique 98 for applying an adhesive layer to a die is set forth according to an embodiment of the invention. Technique 98 may be used to apply adhesive layer 30 to die 26 (FIG. 2) or adhesive 90, 92 to respective dies 68, 70 (FIG. 8) as examples. Technique 98 begins at step 100 by applying an adhesive layer 102 to a top surface 104 of a silicon wafer 106. Wafer 106 is generally sliced from monosilicon crystal ingot or polysilicon crystal ingot and prepared such that a number of contact pads are positioned thereon. As shown, wafer 106 is divided into a plurality of dies 108 by scribe lines 110. Adhesive layer 102 is dispensed onto wafer 106 so as to cover the top surface 104 thereof. According to various embodiments, adhesive layer 102 is applied to wafer 106 in liquid form by film transfer or a spin-on or spray-coating process.

At step 112, after wafer 106 is coated with adhesive layer 102, the adhesive layer 102 is B-staged to partially cure adhesive layer 102. The material composition of adhesive layer 102 is selected such that adhesive layer 102 is not tacky following partial curing at step 112.

At step 114, wafer 106 is sawn or singulated into individual die assemblies 116 along scribe lines 110. Each die assembly 116 includes an individual die 108 with a portion of adhesive layer 102 bonded thereto. At step 118, dies 108 are adhered to a dielectric layer, such as, for example, dielectric layer 12 of FIG. 1, using a vacuum chuck as described with respect to FIGS. 3 and 4. Heat from the vacuum chuck and/or dielectric layer 12 causes the partially cured adhesive layer 60 of dies 108 to become tacky, thereby allowing dies 108 to stick in position on the dielectric layer.

The process set forth in steps 100, 112, 114, 118 may be repeated to position additional dies on the dielectric layer as desired. At step 120, additional heat is applied to adhesive layer 102 to fully cure the adhesive. Alternatively, the vacuum chuck may be configured to heat dies 108 to a temperature that causes adhesive layer 102 to fully cure the adhesive after dies 108 are positioned on the dielectric layer.

Figure 12:
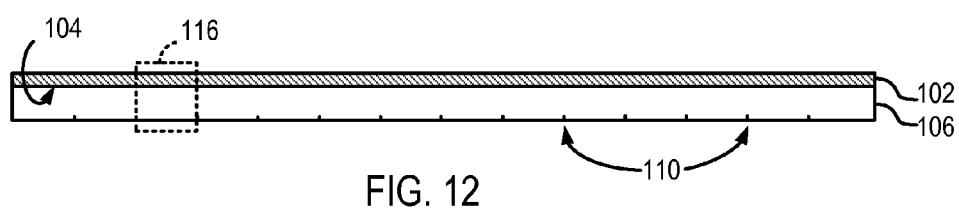
FIG. 12 is a sectional view of the wafer assembly of FIG. 11.
Figure 13:
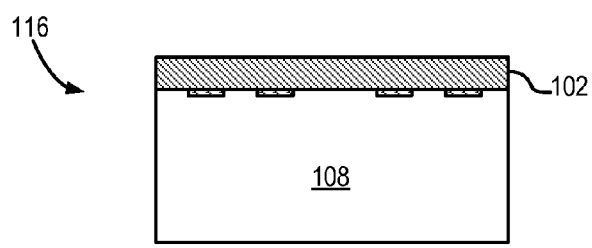
FIG. 13 is a sectional view of a die assembly sawn from the wafer assembly of FIG. 11.
Figure 14:
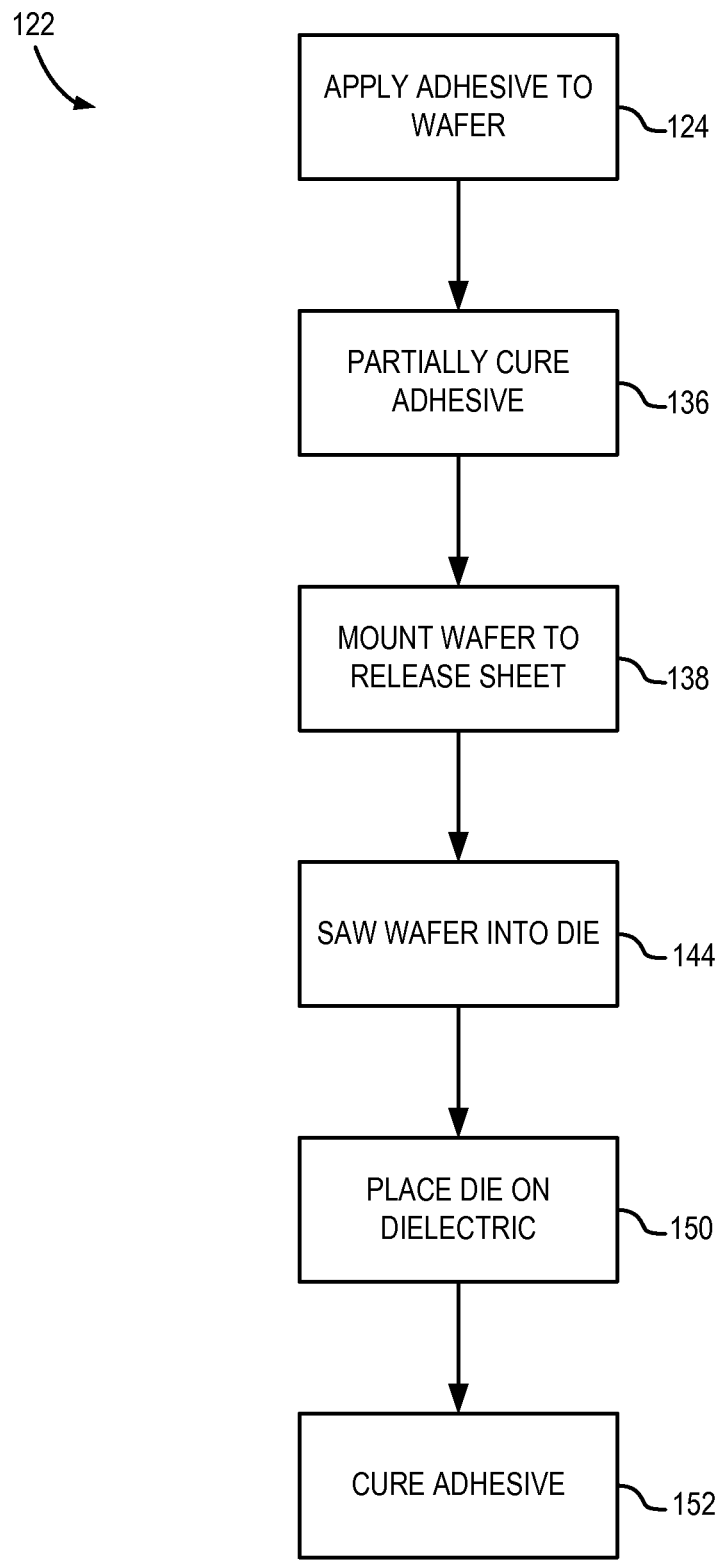
FIG. 14 is a flow chart illustrating steps of making an integrated chip package in accordance with another embodiment of the invention.
Figure 15:
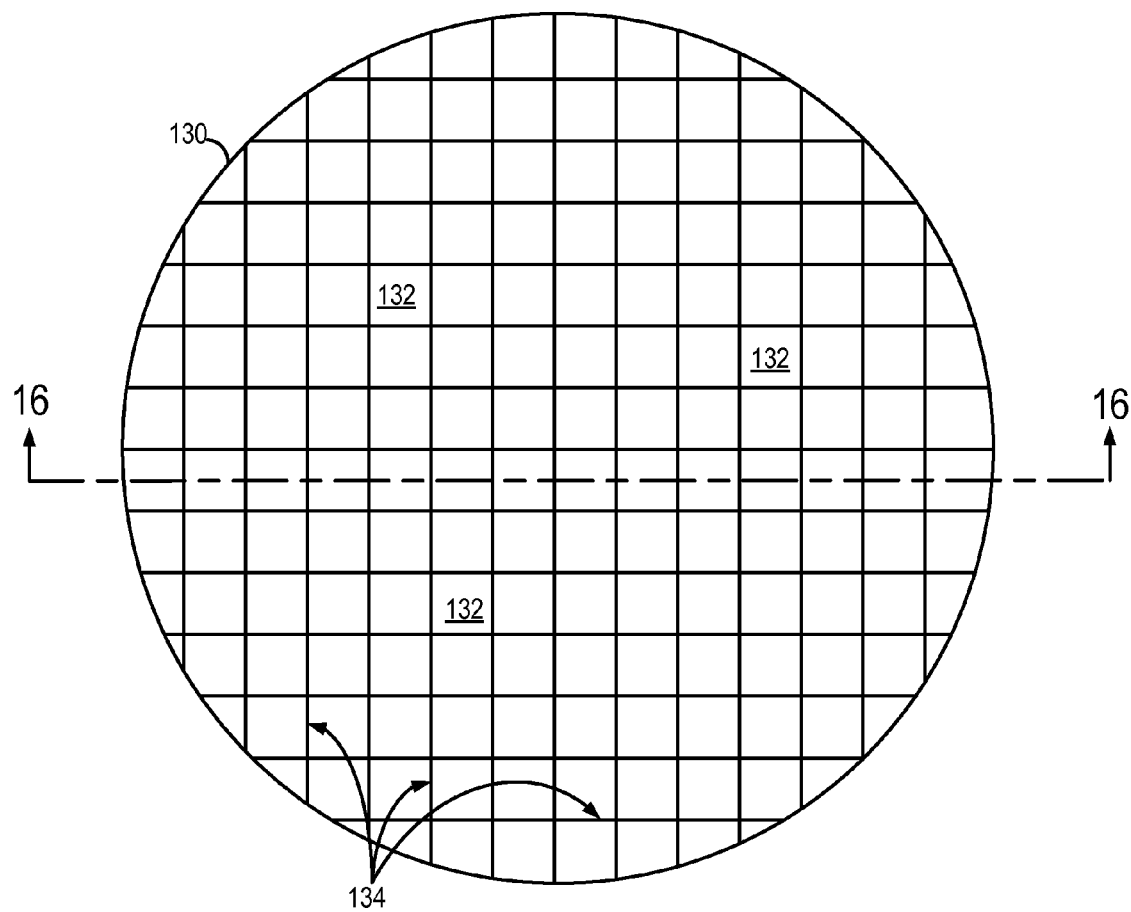
FIG. 15 is a bottom view of a wafer assembly according to an embodiment of the invention.
Figure 16:
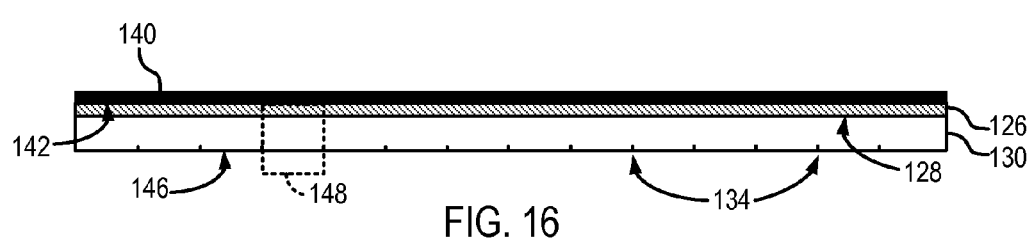
FIG. 16 is a sectional view of the wafer assembly of FIG. 15.
Figure 17:
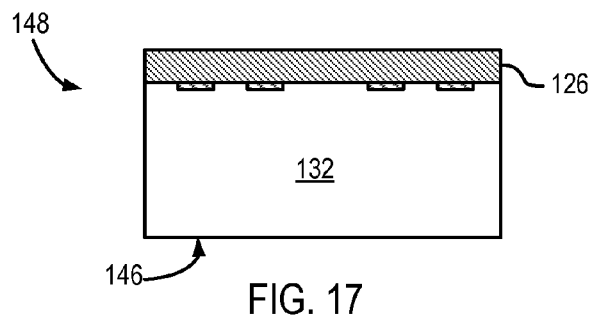
FIG. 17 is a sectional view of a die assembly sawn from the wafer assembly of FIG. 15.

FIGS. 14-17 set forth an alternative technique 122 for applying an adhesive layer to a die. Referring to FIGS. 14-17, technique 122 begins at step 124 by applying an adhesive layer 126 to a top or active surface 128 of a silicon wafer 130, which is divided into a plurality of dies 132 via scribe lines 134 in a similar manner as wafer 106 (FIG. 12). Adhesive layer 126 is applied to top surface 128 of wafer 130 in a similar manner as described above with respect to step 100 of technique 98. At step 136, adhesive layer 126 is partially cured. The catalyst ratio in adhesive layer 126 is selected such that adhesive layer 102 remains tacky following the partial cure.

At step 138, a release sheet 140 is applied to the tacky surface 142 of adhesive layer 126 using low temperature lamination, roll lamination, or other similar technique. At step 144, wafer 130 is sawn from the back side 146 into individual dies 132. An infrared camera may be used to locate scribe lines 134 and align the saw to wafer 130. The saw singulates wafer 130 such that the release sheet 140 remains intact and individual die assemblies 148 remain on release sheet 140 after dies 132 are singulated. As shown, each die assembly 148 comprises a die 132 with an adhesive layer 126 adhered thereto.

At step 150, a vacuum collect picks up individual die assemblies 148 for placement on a dielectric layer, such as dielectric layer 12 of FIG. 1. As each die assembly 148 is removed from release sheet 140, a portion of adhesive layer 126 transfers from release sheet 140 to the active surface 128 of the corresponding die 132. The vacuum chuck then places the respective die assembly 148 adhesive layer side down onto the dielectric layer. After all desired dies are positioned on the dielectric layer using the process set forth in steps 124, 136, 138, 144, and 150, adhesive layer 126 is fully cured at step 152.

Figure 18:
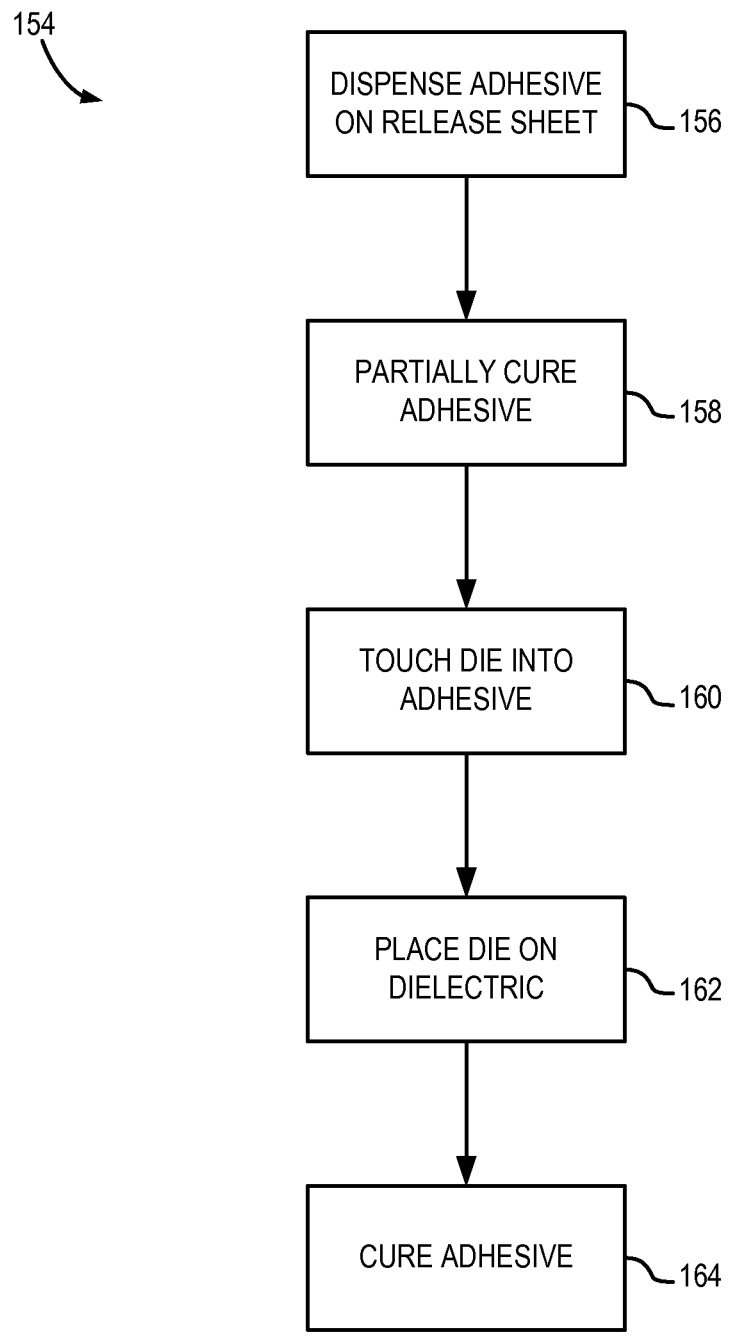
FIG. 18 is a flow chart illustrating steps of making an integrated chip package in accordance with yet another embodiment of the invention.

Referring now to FIG. 18, an alternative technique 154 for applying an adhesive layer to a die prior to attaching the die to a dielectric layer is set forth. At step 156, a release sheet is positioned on the processing system and coated with a layer of adhesive. The adhesive layer is partially cured to B-stage at step 158 and remains tacky after partial curing.

At step 160, a pick-and-place system is used to pick up a singulated die on the back surface of the die and touch down the active surface of the die into the tacky adhesive, thereby coating the active surface with adhesive. The adhesive-coated die is positioned adhesive side down onto the dielectric layer at step 162. After all desired die are positioned on the dielectric layer using the process set forth in steps 156-162, the adhesive is fully cured at step 164.

In an alternative embodiment, a pick-and-place system is used to pick up a singulated die and touch the active surface of the die into a pot of liquid or paste adhesive, rather than an adhesive-coated release sheet as described above. The pickand-place system then transfers the adhesive-coated die to the dielectric layer with or without applying heat to the die. Heating the die during the transfer process gets rid of extra solvent in the adhesive that may cause the die to "swim" or move out of position after being placed on the dielectric layer.

Figure 19:
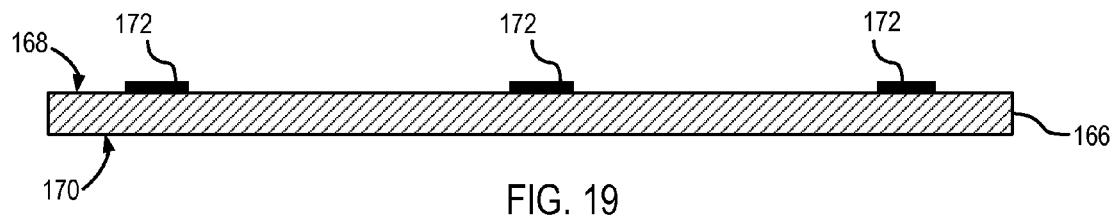
FIGS. 19-24 are schematic diagrams showing steps of a build-up process for an integrated chip package in accordance with another embodiment of the invention.

Referring now to FIGS. 19-24, steps in an alternative technique for manufacturing a chip package, such as chip package 10 (FIG. 6) are set forth, according to an embodiment of the invention, with side cross-sectional views shown at various stages of the build-up process. Referring to FIG. 19, a dielectric layer 166 is provided, similar to dielectric layer 12 (FIG. 1). As shown in FIG. 19, dielectric layer 166 comprises a top surface 168 and a bottom surface 170. According to an optional step of the build-up process, a pre-patterned metal layer 172, similar to metal layer 18 (FIG. 1) may be deposited on the top surface 168 of dielectric layer 166.

Figure 20:
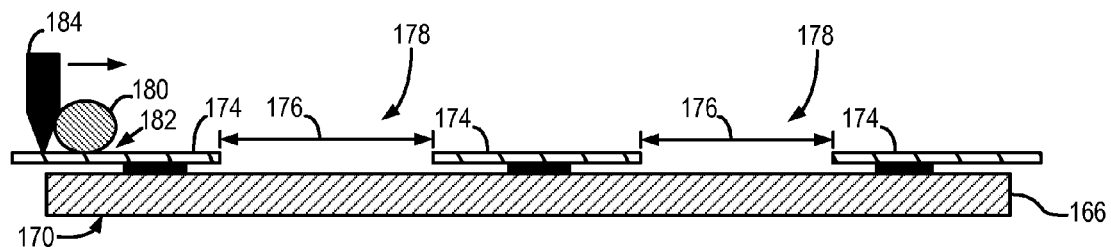
Figure 25:
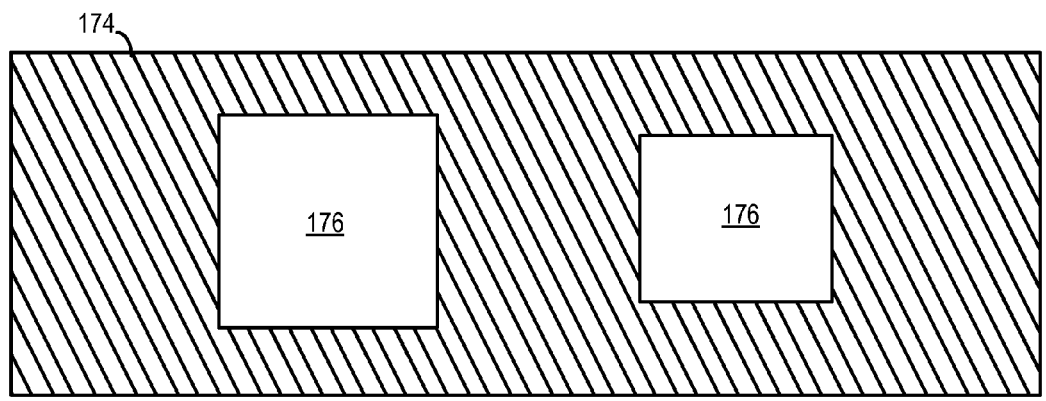
FIG. 25 is a top view of a portion of a metal screen used to dispense a layer of adhesive in accordance with the embodiment set forth in FIGS. 19-24.

Referring to FIG. 20, a metal screen 174 having openings 176 formed therein is aligned atop top surface 168 of dielectric layer 166. FIG. 25 illustrates a top view of a portion of metal screen 174 corresponding to the cross-sectional view of FIG. 20. As shown, openings 176 in metal screen 174 are sized to correspond to the surface area of corresponding die, as described in more detail below.

Figure 21:
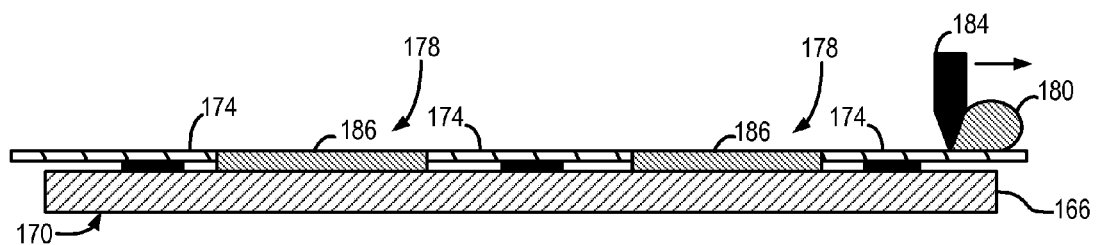

Referring back to FIG. 20, metal screen 174 is aligned with dielectric layer 166 such that openings 176 are positioned atop corresponding die pocket locations 178 on top surface 168 of dielectric layer 166. In a next step of the build-up technique, adhesive 180 is dispensed along an edge 182 of metal screen 174. A squeegee 184 is brought into place adjacent adhesive 180. Squeegee 184 is drawn across metal screen 174, leaving a layer of adhesive 186 in respective die pockets 178, as shown in FIG. 21.

Figure 22:
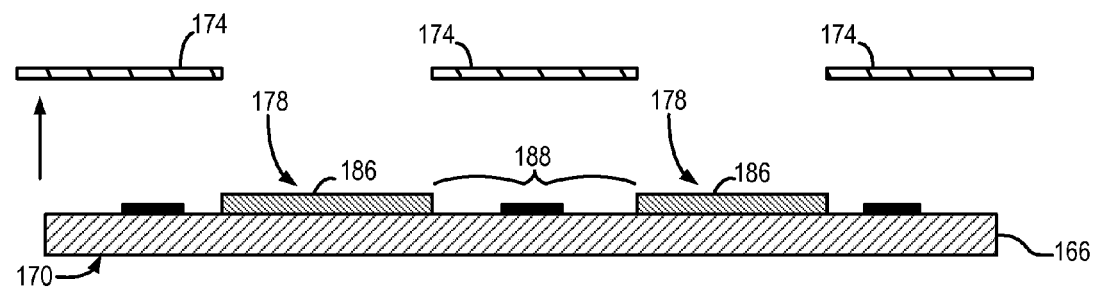

Referring now to FIG. 22, in a next step of the build-up technique of chip package 10, metal screen 174 is separated from dielectric layer 166 and removed. As shown in FIG. 22, an adhesive-free gap 188 is formed between adjacent portions of the resulting adhesive layer 186. After metal screen 174 is removed, adhesive layer 186 is B stage cured to a tacky state.

Figure 23:
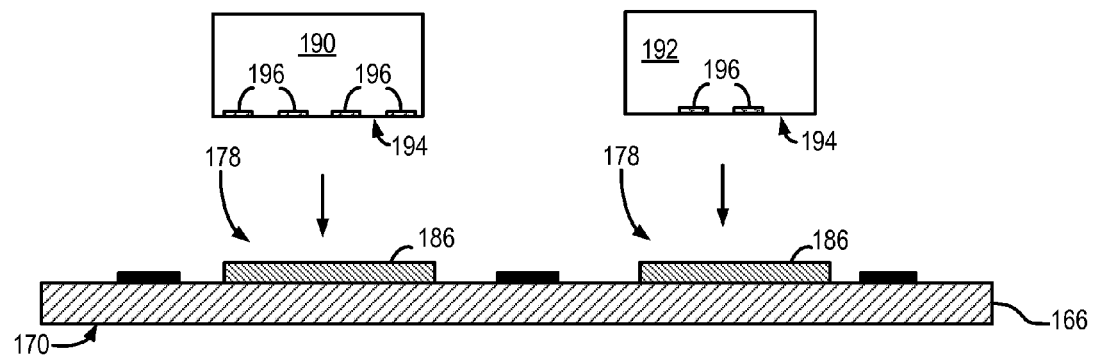
Figure 24:
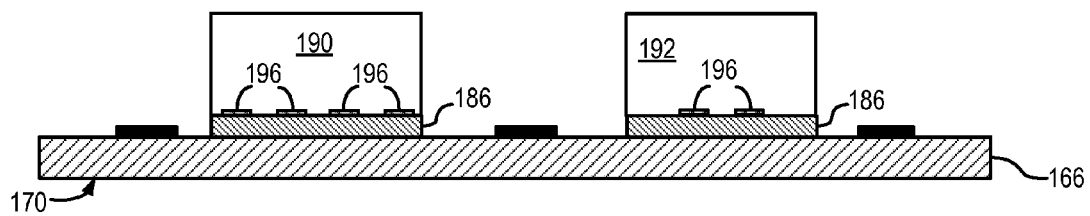
Figure 26:
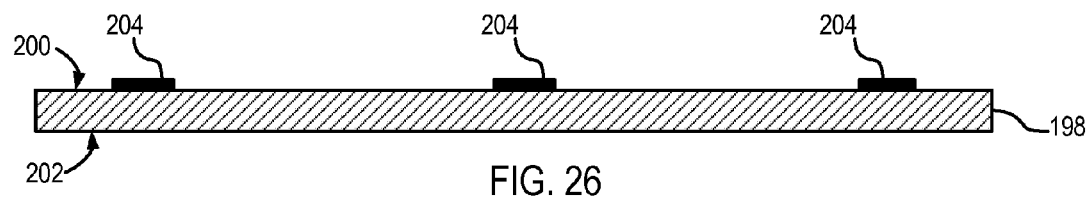
FIGS. 26-29 are schematic diagrams showing steps of a build-up process for an integrated chip package in accordance with another embodiment of the invention.

Next, dies 190, 192 are aligned with die locations 178 and respective portions of adhesive layer 186, as shown in FIG. 23, using a pick-and-place machine or vacuum chuck. As shown, each die 190, 192 has an active surface 194 with any number of die pads 196. Similar to die 26 of FIG. 2, die 190, 192 may be any of various die types, such as, for example, a memory die type, a processing die type, a logic die type, and an application specific integrated circuit (ASIC) die type. Referring to FIG. 24, after die 190, 192 are positioned atop adhesive 186, adhesive 186 is fully cured. As one skilled in the art will readily recognize, in subsequent steps of the build-up technique, vias and metallization paths may be formed on dielectric layer 166 in a similar manner as described with respect to FIG. 6 to form a chip package such as chip package 10.

Referring now to FIGS. 26-29, steps in an alternative technique for manufacturing a chip package, such as chip package 10 (FIG. 6) are set forth, according to another embodiment of the invention, with side cross-sectional views of chip package 10 being shown at various stages of the build-up process. Referring to FIG. 25, a dielectric layer 198 is provided, similar to dielectric layer 12 (FIG. 1), having a top surface 200 and a bottom surface 202. Optionally, a metal layer 204 may be deposited or pre-patterned on top surface 168 of dielectric layer 198.

Figure 27:
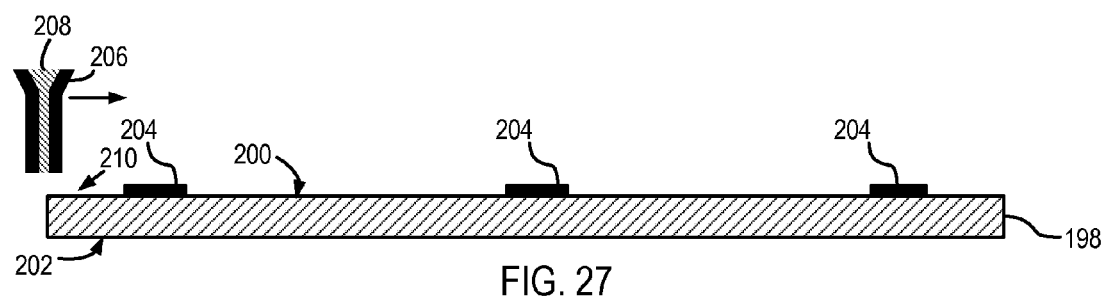
Figure 28:
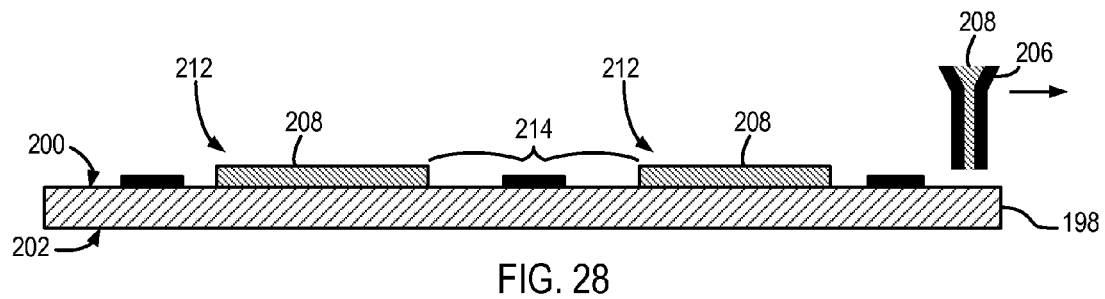

In a next step of the build-up technique, an inkjet printer-head 206 filled with adhesive 208 is positioned at an edge 210 of dielectric layer 198, as shown in FIG. 27. As inkjet 206 printer head travels across dielectric layer 198, adhesive 208 is dispensed in a pattern across top surface 200 of dielectric layer 198 at respective die locations 212. As shown in FIG. 28, adhesive 208 is dispensed such that a gap 214 is formed on top surface top surface 200 of dielectric layer 198 between adjacent die locations 212. Gap 214 is substantially free of adhesive.

Figure 29:
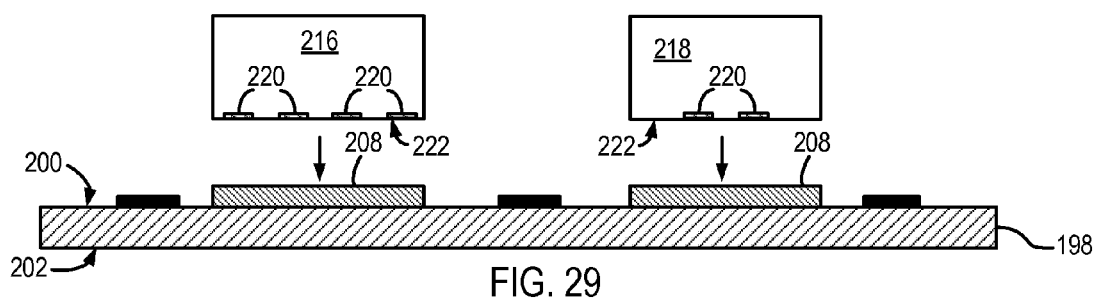

Adhesive 208 is then B stage cured to a tacky state. Next, dies 216, 218 having any number of contact pads 220 are aligned with adhesive 208. The respective active surface 222 of each die 216, 218 is placed into adhesive 208 using a pick-and-place machine or vacuum chuck, as shown in FIG. 29. Adhesive 208 is subsequently fully cured. As one skilled in the art will readily recognize, in subsequent steps of the build-up technique, vias and metallization paths may be formed on dielectric layer 198 in a similar manner as described with respect to FIG. 6 to form a chip package such as chip package 10.

Figure 30:
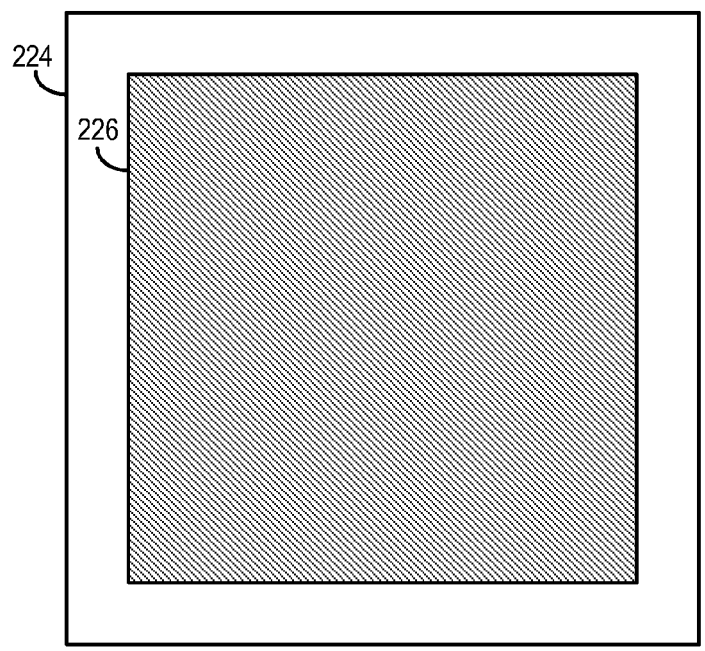
FIG. 30 is a top view diagram of a release sheet coated with an adhesive layer in accordance with an embodiment of the invention.
Figure 31:
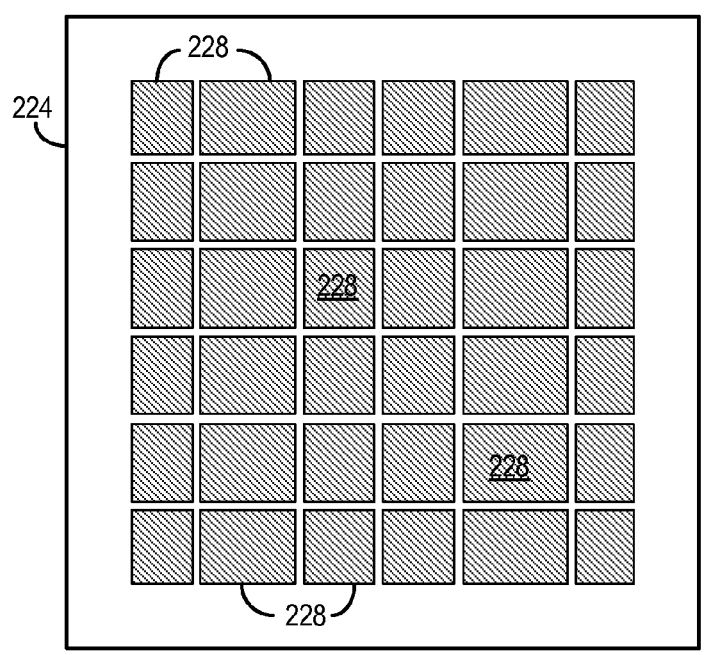
FIG. 31 is a top view diagram of the adhesive-coated release sheet of FIG. 30 after scribing the adhesive layer into die sizes.
Figure 32:
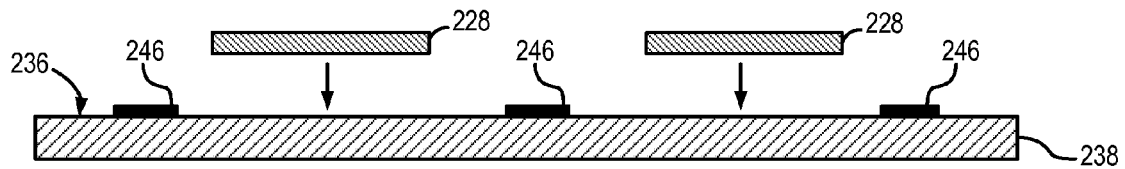
FIGS. 32-35 are schematic diagrams showing steps of a build-up process for an integrated chip package in accordance with yet another embodiment of the invention.
Figure 33:
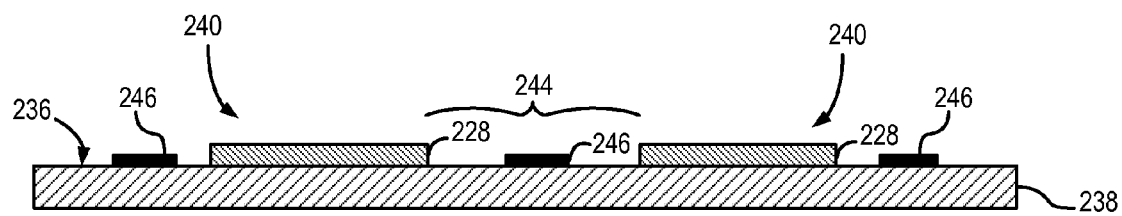
Figure 34:
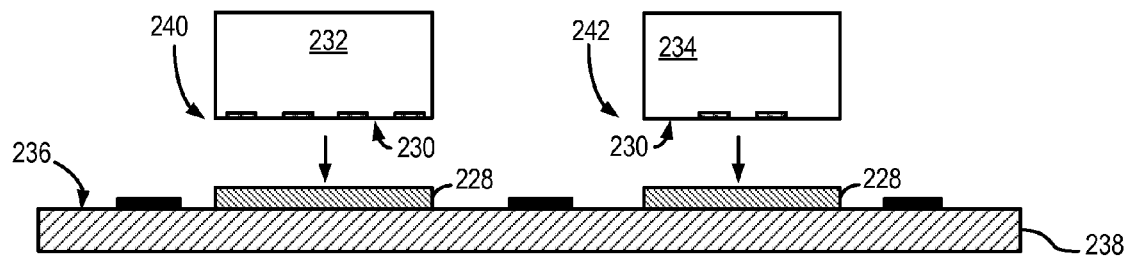

Referring now to FIGS. 30-35, steps in an alternative technique for manufacturing a chip package are set forth, according to yet another embodiment of the invention. Referring first to FIG. 30, a release sheet 224 is coated with an adhesive layer 226. Adhesive layer 226 is then baked to B stage to partially cure adhesive layer 226. Adhesive layer 226 may be baked to a tacky state or non-tacky state, according to various embodiments. In a next step of the manufacturing process, adhesive layer 226 is scribed or cut (e.g., via a laser) into individual adhesive portions 228 sized to substantially match the surface area of the active surface 230 of individual dies 232, 234 (FIG. 34).

Figure 35:
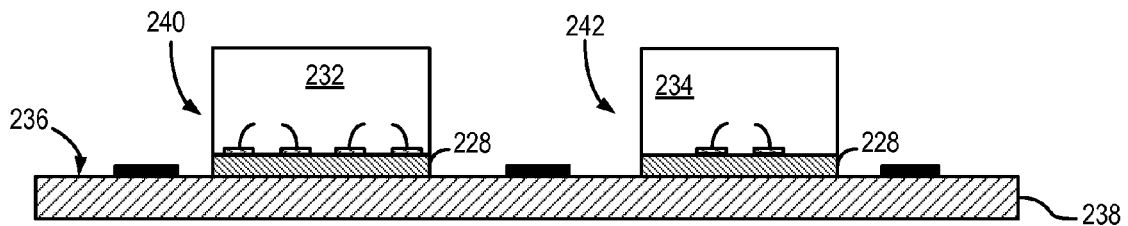

Referring now to FIGS. 32 and 33, adhesive portions 228 are positioned on a top surface 236 of a polyimide flex layer or dielectric layer 238 at respective die locations 240, 242 leaving a gap 244 on dielectric layer 238 between adjacent adhesive portions 228. In one embodiment, top surface 236 of dielectric layer 238 has a pre-patterned metal interconnection layer 246 formed thereon. In a next step of the manufacturing process, dies 232, 234 are aligned with respective die locations 240, 242 using, for example, a vacuum chuck or pick-and-place machine, as shown in FIG. 34. In an embodiment where adhesive layer 226 was cured to a tacky state, the respective active surfaces 230 of dies 232, 234 are placed into respective adhesive portions 228. In an embodiment where adhesive layer 226 was cured to a non-tacky state, dies 232, 234 and/or dielectric layer 238 are heated prior to placement of dies 232, 234. Heat from dies 232, 234 and/or dielectric layer 238 causes adhesive portions 228 to become tacky and dies 232, 234 to bond to adhesive portions 228, as shown in FIG. 35. Adhesive portions 228 are then fully cured. As one skilled in the art will readily recognize, in subsequent steps of the build-up technique, vias and metallization paths may be formed on dielectric layer 238 in a similar manner as described with respect to FIG. 6 to form a chip package such as chip package 10.

Accordingly, embodiments of the invention overcome the aforementioned drawbacks in the prior art of coating the entire dielectric layer with adhesive by providing a method of chip fabrication in which the adhesive is applied directly to one of the active surface of the die and select portions of the dielectric layer corresponding to die locations prior to positioning the die on the dielectric layer. Thus, the surface of the dielectric substrate of the resulting integrated circuit device has at least one portion with adhesive thereon and at least one portion that is substantially free of adhesive. Applying adhesive to the die directly simplifies the processing steps, reduces subsequent processing steps, allows dies to be placed more closely together, and significantly reduces the amount of adhesive on the surface of the dielectric layer, thereby minimizing unbalanced stresses and reducing material costs.

Therefore, according to one embodiment of the invention, a chip package includes a first die comprising an active surface having at least one die pad positioned thereon; a first adhesive layer having a first surface coupled to the active surface of the first die and a second surface opposite the first surface; and a first dielectric layer having a top surface, wherein a first portion of the top surface of the first dielectric layer is coupled to the second surface of the first adhesive layer. A second portion of the top surface of the first dielectric layer, distinct from the first portion, is substantially free of adhesive.

According to another embodiment of the invention, a method of forming an integrated chip package includes providing a first semiconductor die comprising an active surface having at least one contact pad positioned thereon, applying an adhesive layer to the active surface of the first semiconductor die, and adhering the first semiconductor die having the adhesive layer applied thereto to a top surface of a dielectric substrate by way of the adhesive layer.

According to yet another embodiment of the invention, an integrated chip package includes a dielectric substrate and a first die assembly. The first die assembly includes a semiconductor die having an active surface with contact pads positioned thereon and a non-conductive adhesive layer having a first surface coupled to the active surface of the semiconductor die. A surface area of the first surface of the adhesive layer is substantially equal to a surface area of the active surface of the semiconductor die. A second surface of the adhesive layer, opposite the first surface, is coupled to a surface of the dielectric substrate. A subportion of the surface of the flexible substrate adjacent to the first die assembly is substantially free of adhesive.

According to yet another embodiment of the invention, a method of forming an integrated chip package includes providing a dielectric substrate having a die location positioned on a top surface thereof, providing a first semiconductor die comprising an active surface having at least one contact pad positioned thereon, and applying an adhesive layer to one of the active surface of the first semiconductor die and the die location of the dielectric substrate. The adhesive layer has a surface area approximately equal to the surface area of the active surface of the first semiconductor die. The method further includes adhering the first semiconductor die to the top surface of the dielectric substrate by way of the adhesive layer.

According to yet another embodiment of the invention, a method of forming an integrated chip package includes providing a dielectric substrate having a plurality of die locations positioned on a surface thereof and applying a patterned adhesive layer onto the plurality of die locations of the dielectric substrate such that a gap is formed on the surface of the dielectric substrate between adjacent die locations, the gap being substantially free of adhesive. The method also includes adhering a plurality of semiconductor dies to the dielectric substrate via the adhesive layer.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of forming an integrated chip package comprising:
   providing a first semiconductor die comprising an active surface having at least one contact pad positioned thereon;
   applying an adhesive layer to the active surface of the first semiconductor die; and
   adhering the first semiconductor die having the adhesive layer applied thereto to a top surface of a dielectric substrate by way of the adhesive layer;
   wherein applying the adhesive layer to the active surface of the first semiconductor die comprises:
      applying the adhesive layer to a semiconductor wafer such that a first surface of the adhesive layer is in contact with an active surface of the semiconductor wafer; and
      singulating the first semiconductor die from the semiconductor wafer.

2. The method of claim 1 further comprising coupling a release sheet to a second surface of the adhesive layer, opposite the first surface, prior to singulating the first semiconductor die.

3. The method of claim 1 further comprising B-stage curing the adhesive layer prior to singulating the first semiconductor die.

4. The method of claim 1 further comprising:
   providing a second semiconductor die comprising an active surface having at least one die pad positioned thereon;
   applying an adhesive layer to the active surface of the second semiconductor die; and
   adhering the second semiconductor die having the adhesive layer applied thereto to the top surface of the dielectric substrate.

5. The method of claim 4 further comprising positioning the first semiconductor die and the second semiconductor die on the top surface of the dielectric substrate such that a gap is formed on the top surface of the dielectric substrate between the adhesive layers of the first and second semiconductor die.

6. The method of claim 1 further comprising:
   forming a first metallization layer on the top surface of the dielectric substrate; and
   forming a first plurality of metalized connections through the dielectric substrate, the first plurality of metalized connections in contact with at least one of the first metallization layer and the at least one contact pad.

* * * * *